United States Patent
Giles et al.

[11] 3,937,979
[45] Feb. 10, 1976

[54] PHOTOPARAMETRIC AMPLIFYING UPCONVERTER

[75] Inventors: Michael K. Giles; Walter E. Freitag, both of China Lake, Calif.

[73] Assignee: The United States of America as represented by the Secretary of the Navy, Washington, D.C.

[22] Filed: Dec. 7, 1973

[21] Appl. No.: 422,810

[52] U.S. Cl. .............................. 307/88.3; 325/449
[51] Int. Cl.² ............................................ H03F 7/04
[58] Field of Search ....... 307/88.3; 330/4.9; 332/52, 332/56; 325/451, 449

[56] References Cited
UNITED STATES PATENTS

| | | | |
|---|---|---|---|
| 3,132,258 | 5/1964 | Gaertner et al. | 307/88.3 |
| 3,280,336 | 10/1966 | Roulston | 307/88.3 |

OTHER PUBLICATIONS

Penfield et al., Proc. IEEE, April 1965, pp. 340–347.

Primary Examiner—R. V. Rolinec
Assistant Examiner—Darwin R. Hostetter
Attorney, Agent, or Firm—R. S. Sciascia; Roy Miller

[57] ABSTRACT

A low frequency photoparametric amplifying upconverter comprising an indium antimonide or silicon photodiode, source of pumping voltage and clamping device to clamp the diode in a self biased condition, all functioning to amplify an input signal applied to the photodiode.

3 Claims, 3 Drawing Figures

PHOTOPARAMETRIC AMPLIFYING UPCONVERTER

BACKGROUND OF THE INVENTION

1. Field of the Invention

Reverse biased silicon p-n junction photodiodes are widely used for applications which require the detection of intensity-modulated light in the spectral wavelength range of 0.2 to 1.1 microns. In recent years, the sensitivity of these photodiodes, which operate at room temperature, has increased to the point that they are now challenging the monopoly once held by the photomultiplier in low-light-level sensing systems. Similarly, the need for highly sensitive photodetectors in the 3 to 5 micron region of the infrared spectrum is being fulfilled by photovoltaic indium antimonide devices which operate at 77°K.

Both silicon and indium antimonide photodiodes produce an output which is proportional to the intensity of the incident radiation; therefore, the output of these devices is a true replica of the intensity-modulated input signal. However, the output of these devices is so small, especially in the case of indium antimonide photodiodes, that a low-noise preamplifier is generally used to boost the signal amplitude to a useful level.

An alternative approach has been used successfully with silicon photodiodes employed as sensors of light which is intensity-modulated at microwave frequencies. This technique, in which both photodetection and amplification take place within a single p-n junction, is called photoparametric amplification. The primary advantage of this technique is its improved noise performance.

2. Description of the Prior Art

Photoparametric operation of a photodiode was first predicted by Ahlstrom, Matthei and Gartner in July 1959 ("REV SCI INST," July, 1959, pp. 592–593). It was first demonstrated by Saito in 1962 and reported in "Proceedings of the IRE," November, 1962, pp. 2369–2370. Shortly thereafter, in September 1963, David E. Sawyer reported the successful operation of a negative resistance photoparametric amplifier in "Proceedings of the IEEE," September, 1963, page 1238. Detailed analyses were then carried out separately by Saito and Fugii and Penfield and Sawyer and reported respectively in "Proceedings of the IEEE", August, 1964, pp. 978–979 and "Proceedings of the IEEE," April, 1965, at page 340. They essentially predicted that, if high Q photodiodes are employed, the photoparametric amplifier should provide an amplified output with a signal-to-noise ratio nearly equal to that of the unamplified output of the same photodiode. This prediction was experimentally confirmed in 1966 by Grace and Sawyer, who utilized a specially fabricated silicon device with a $p$ -$v$-$n$-$n^+$ construction designed for excellent photodetection properties but also retaining a high Q for good parametric operation. This was reported in the IEEE TRANSACTIONS ON ELECTRONIC DEVICES, December, 1966, at pages 903 and 904. Roulston, in 1968, made a similar analysis for a photoparametric upconverter which he also verified and reported in the "IEEE Journal of Solid-State Circuits," December, 1968, pp. 431–440.

The devices reported in Sawyer and Roulston both operate with high frequency pumps ie, greater than 600 megahertz. Therefore these devices require microwave structure with the attended requirement of high precision components.

SUMMARY OF THE INVENTION

Briefly, the present invention comprises a low frequency photoparametric amplifying upconverter which utilizes a pumping source, isolating and clamping capacitor, photodiode and load resistance, all connected in series. The input for the photoparametric amplifying upconverter is the junction current generated by illumination of the photodiode. Thus, the photoparametric amplifying upconverter is simply a $p$-$n$ junction that is illuminated to act as a photodiode and pumped so that it operates as a photoparametric amplifying upconverter.

DESCRIPTION OF THE PREFERRED EMBODIMENT

An amplifier may be defined as an input-output device in which an input signal causes a variation in the amount of energy flowing from an energy source to an output load. Useful gain is provided by an amplifier if the power which it delivers to the output load is greater than the power which it receives from the input signal.

A parametric amplifier differs from a conventional amplifier in two ways: (1) it uses an AC rather than a DC energy source, and (2) it channels power from the energy source to the output load by modulating an energy storage element such as an inductor or a capacitor rather than an effective resistance. Parametric amplifiers are therefore relatively noise-free when compared to conventional amplifiers because energy storage elements, unlike resistances, do not give rise to thermal noise.

Photoparametric amplifiers differ from conventional parametric amplifiers in one respect i.e.; the input signal. The input for a photoparametric amplifier is the junction current generated by illumination of the photodiode. Thus, a photoparametric amplifier is simply a $p$-$n$ junction that is illuminated to act as a photodiode and pumped so that it operates as a parametric amplifier.

The analysis of photoparametric amplification is equivalent to that of parametric amplification with the input modified to account for the photo-generated input current. A detailed analysis of the operation of both parametric and photoparametric amplifiers is given in the "Proceedings of the IEEE," April 1965, page 340 by Penfield, P., Jr., and D. E. Sawyer.

Figure 1:
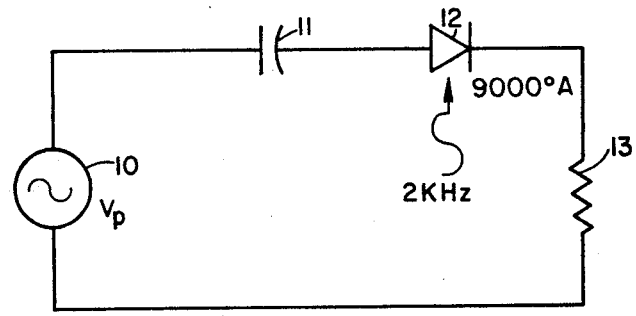
FIG. 1 is a circuit schematic of a silicon photoparametric upconverter.

The circuit of FIG. 1 illustrates one embodiment of the present invention comprising a low-frequency photoparametric up-converter utilizing a silicon diode as the photoparametric amplifier. In FIG. 1, a pumping means comprising a sinusoidal function generator 10 is connected in series through an isolating capacitor 11 to a silicon photodiode 12. The silicon diode 12 is connected to one side of load resistor 13, the other side of which is connected back to the pump source 10. In the present embodiment, the sinusoidal generator was operated at one megahertz, the capacitor 11 was 100 pico-farads and the load comprised a 50Ω resistor. Larger load resistors (up to 10KΩ) have also been used successfully.

The pump signal is obtained from the sinusoidal function generator 10 and the capacitor 11 serves to separate the pump and signal currents so that parametric mixing of the two frequencies can occur in the diode. The capacitor, together with the rectification action of the diode, clamps the diode to a reverse biased condition. The input signal was obtained from a light emitting diode which emits radiation at 9,000 A. The light emitting diode was driven with a 2 KHz sinusoidal current with a peak-to-peak amplitude of 56 $\mu a$.

With a sinusoidal pump voltage of 2.8 volts peak-to-peak across the photodiode, the observed power gain was 23 db.

Figure 2:
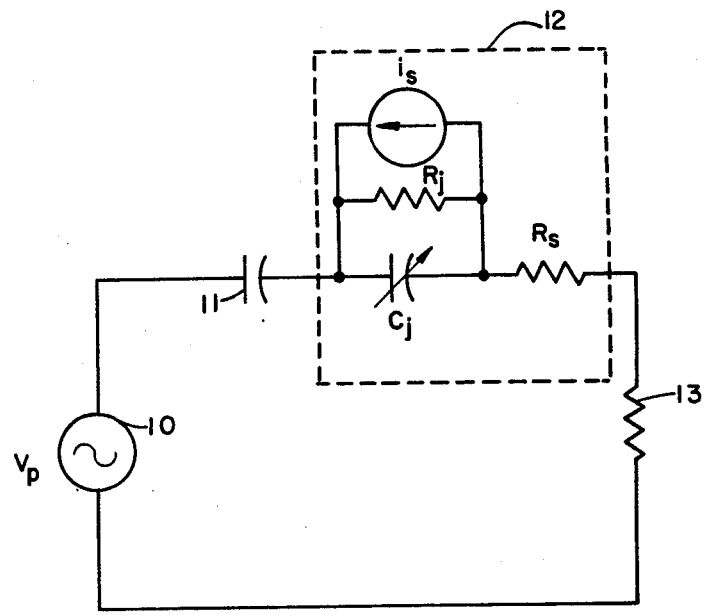
FIG. 2 is a schematic with the photodiode equivalent circuit of FIG. 1.

The equivalent circuit of the photodiode is illustrated in FIG. 2. The characteristics of the silicon diode are set forth in the table below.

| | |
|---|---|
| Diameter | 0.040 in |
| Active Area | 0.81 mm² |
| $C_j$ (zero bias) | 7.5 pF |
| $R_j$ | 1 MΩ |
| $R_s$ | 100 Ω |
| $\phi$ (forward cuton voltage) | 0.5V |
| $V_R$ (reverse breakdown voltage) | 45V |

Figure 3:
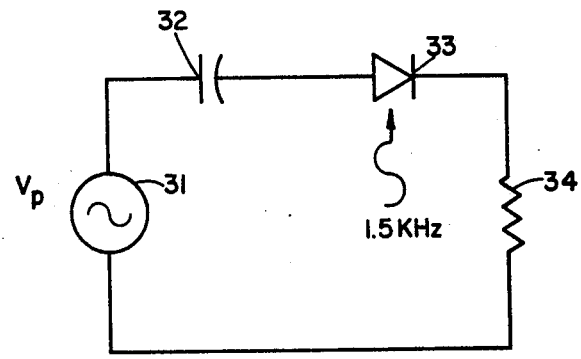
FIG. 3 is a circuit schematic of an indium antimonide photoparametric upconverter.

FIG. 3 is a circuit schematic of an indium antimonide photoparametric upconverter comprising again, a source of pumping voltage 31, an isolating and clamping capacitor 32, photodiode 33 and load resistor 34 all connected in series. The pump 31 was operated at one megahertz, the capacitor in this case was 2200 pF and again the load was a 50 Ω resistor. The indium antimonide photodiode was illuminated by 1.5 KHz chopped radiation from a 500°K blackbody.

The photodiode used in the embodiment of FIG. 3 had the characteristics as set forth in the table below.

| | |
|---|---|
| Diameter | 2 mm |
| Active Area | 3.14 mm² |
| $C_j$ (zero bias) | 1200 pF |
| $R_j$ | 500 KΩ |
| $\phi$ (cuton voltage) | 10 mV |
| $V_R$ (reverse breakdown) | 300 mV |

-continued a power gain of 5 db was obtained using the circuit configuration of FIG. 3.

Low frequency photoparametric amplification is possible in both silicon and indium antimonide using the circuitry of the present invention. This creates a new concept in the detection and amplification of intensity modulated infrared radiation, that of performing both operations simultaneously within the same p-n junction. The advantages of using the photoparametric upconverter rather than the conventional photodetector-preamplifier combination lie in the greatly simplified circuitry and the improved noise performance of the photoparametric upconverter configuration. Further, the output provided is broad band.

What is claimed is:
1. A low frequency photoparametric amplifying upconverter comprising:
   pump means for providing a pumping voltage of a frequency of approximately one megahertz;
   an output load;
   photodiode means operatively connected in series with said pump means and said load means;
   clamping means comprising an isolating capacitor also connected in series with said pump means and said photodiode means for clamping the photodiode means in a reverse bias condition and for blocking the input signal;
   said photodiode being pumped so that it operates as a photoparametric amplifying upconverter;
   the input signal for the photoparametric amplifying upconverter comprising the junction current generated by illuminating the photodiode means.
2. A low frequency photoparametric amplifying upconverter as set forth in claim 1 wherein;
   said photodiode means comprises a silicon photodiode.
3. A low frequency photoparametric amplifying upconverter as set forth in claim 1 wherein;
   said photodiode means comprises an indium antimonide photodiode.

* * * * *